United States Patent [19]

Kuo et al.

[11] Patent Number: 5,103,425
[45] Date of Patent: Apr. 7, 1992

[54] ZENER REGULATED PROGRAMMING CIRCUIT FOR A NONVOLATILE MEMORY

[75] Inventors: Clinton C. Kuo; Ko-Min Chang; Mark S. Weidner; Philip S. Smith, all of Austin, Tex.

[73] Assignee: Motorola, Inc., Schaumburg, Ill.

[21] Appl. No.: 666,964

[22] Filed: Mar. 11, 1991

[51] Int. Cl.$^5$ .............................................. G11C 7/02
[52] U.S. Cl. ...................................... 365/226; 365/96; 365/104; 365/185; 307/296.6; 307/318; 357/23.5
[58] Field of Search .................. 365/226, 96, 103, 104, 365/185; 307/296.6, 318; 357/23.5

[56] References Cited

U.S. PATENT DOCUMENTS

| | | | |
|---|---|---|---|
| 4,433,390 | 2/1984 | Carp et al. | 365/226 |
| 4,482,985 | 11/1984 | Itoh et al. | 365/226 |
| 4,758,994 | 7/1988 | Bhuva | 307/296.6 |
| 4,972,375 | 11/1990 | Ueno et al. | 365/226 |
| 4,972,377 | 11/1990 | Lee | 365/226 |
| 4,975,883 | 12/1990 | Baker et al. | 365/226 |

OTHER PUBLICATIONS

IEEE Trans. on Electon Devices, "Hi-MNOS II Technology for a 64-kbit Byte-Erasable 5-V-Only EE-PROM," Yuji Yatsuda et al., vol. ED-32, No. 2, Feb. 1985, pp. 224-231.

1991 Symposium on VLSI Circuits, "A 512Kb Flash EEPROM for a 32 Bit Microcontroller," Oiso, Japan, May 30, 1991-Jun. 1, 1991, pp. 87-88.

Primary Examiner—Joseph E. Clawson, Jr.
Attorney, Agent, or Firm—Robert L. King

[57] ABSTRACT

Zener diodes that are formed concurrently with flash EEPROM cells are utilized to regulate programming voltages for programming a flash EEPROM cell (37). A selected bit-line (38) is voltage regulated with both a zener diode (19) and a bias transistor (36). The bias transistor is activated during programming to prevent breaking down a drain junction of a flash EEPROM cell, which would generate hot-electrons and cause a runaway programming problem. The regulated voltage on the bit-line is also utilized to optimize programming characteristics of a flash EEPROM cell, and to minimize disturbing a programmed logic state of flash EEPROM cells connected to a commonly selected bit-line. A separate zener diode (17) provides a regulated voltage for a selected word-line (40) during programming. By regulating the voltage of the word-line during programming, a program disturb problem associated with a high voltage word-line is minimized.

8 Claims, 3 Drawing Sheets 5,103,425

ZENER REGULATED PROGRAMMING CIRCUIT FOR A NONVOLATILE MEMORY

FIELD OF THE INVENTION

This invention relates generally to memory devices, and more particularly, to nonvolatile memory devices.

BACKGROUND OF THE INVENTION

Memory devices that retain a logic state during a power-down situation are termed "nonvolatile" memory devices. Various type of nonvolatile memory devices include, but are not limited to, a ROM, a PROM, an EPROM, an EEPROM, and a flash EEPROM. Further, each of the above-mentioned nonvolatile memory circuits has a predetermined method of being programmed and erased. For example, an array of flash EEPROM cells, each comprised of a floating gate transistor, is erased in accordance with a bulk erase procedure. Once the flash EEPROM cells have been bulk erased, selected flash EEPROM cells are programmed using various methods. The various methods of programming flash EEPROM cells generally require high voltages on a gate and a drain terminal of a selected flash EEPROM cell. However, there are various constraints associated with the high voltages required for programming flash EEPROM cells. The various constraints include, but are not limited to: (1) limiting the voltage on selected bit-lines to be below the drain junction breakdown voltage of the flash EEPROM cell to prevent a runaway programming of adjacent flash EEPROM cells; (2) optimizing the voltages on selected terminals of a flash EEPROM cell for optimum programming characteristics; and (3) minimizing the voltages at the selected terminals of the flash EEPROM cells to minimize disturbing the logic state of flash EEPROM cells. Therefore, a need exists to control voltages of flash EEPROM programming circuits for optimum programming operations.

SUMMARY OF THE INVENTION

The previously mentioned requirements are fulfilled with the present invention. In one form, a regulated programming circuit and method for a nonvolatile memory, is taught by having a plurality of nonvolatile memory bit cells arranged in an array of bit-line columns and word-line rows. The regulated programming circuit is comprised of a first voltage regulation means having a constant breakdown voltage diode. The first voltage regulation means receives a voltage having a value substantially larger than an internal voltage which is coupled to the bit-line columns and provide a regulated output voltage. The regulated programming circuit is further comprised of a bit-line voltage regulation means coupled to the first voltage regulation means for creating a biasing current from the regulated output voltage to regulate the bit-line columns to a predetermined value. The regulated programming circuit is also comprised of a second voltage regulation means having a constant breakdown voltage diode. The second voltage regulation means receives a voltage having a value substantially larger than an internal voltage which is coupled to the word-line rows. The regulated programming circuit is also comprised of a plurality of floating-gate transistors, each transistor being coupled to a predetermined bit-line to form a memory bit cell.

These and other features, and advantages, will be more clearly understood from the following detailed description taken in conjunction with the accompanying drawings.

DESCRIPTION OF A PREFERRED EMBODIMENT

Figure 1:
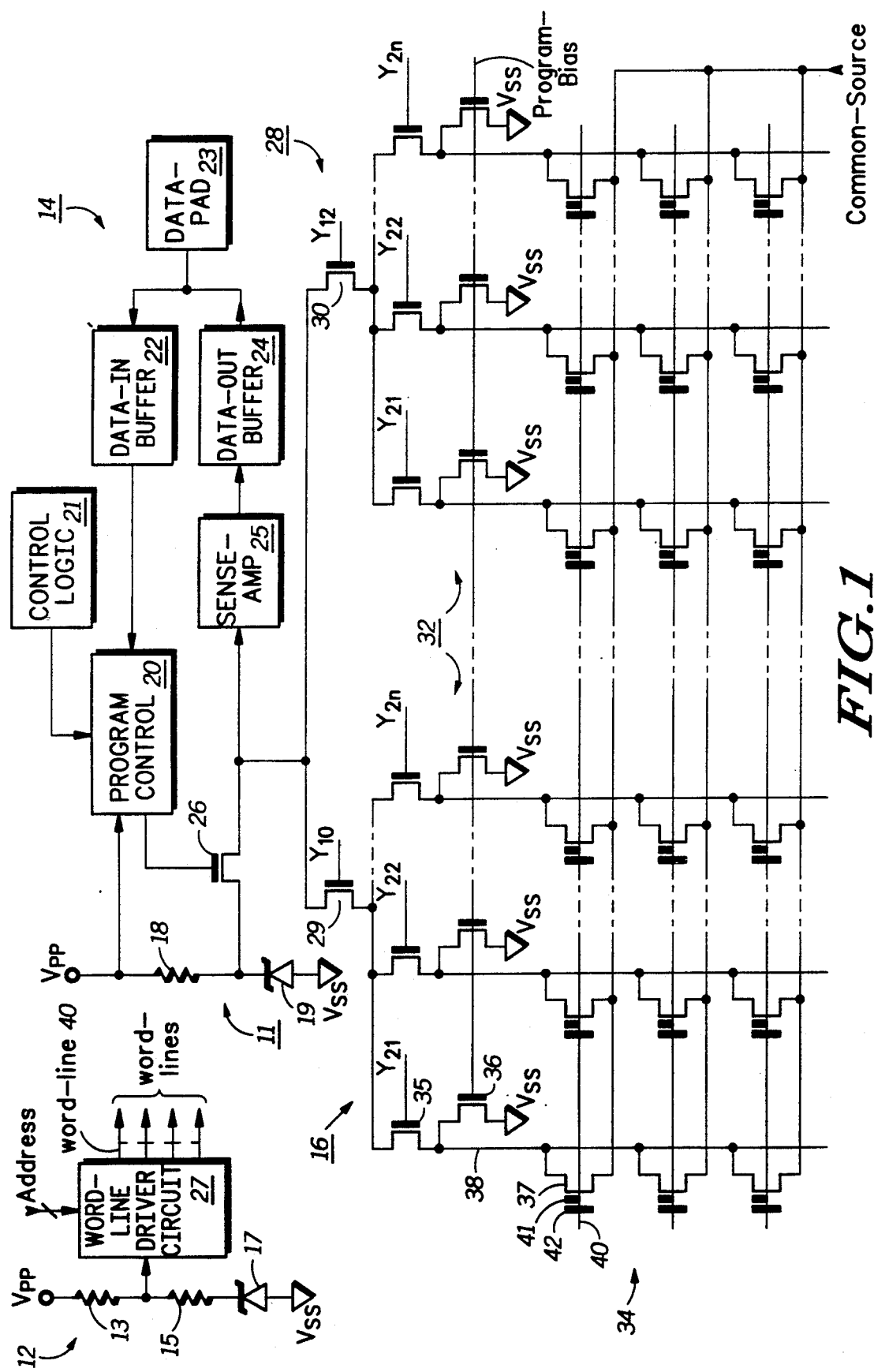
FIG. 1 illustrates in partial schematic diagram form an array of flash EEPROM cells and a programming circuit in accordance with the present invention.

FIG. 1 illustrates a flash EEPROM circuit having a first voltage regulation portion 11, a second voltage regulation portion 12, a control portion 14, a flash EEPROM array with decode portion 16, and a word-line driver circuit 27 coupled to the second voltage regulation portion 12. The first voltage regulation portion 11 has a resistor 18, and a zener diode 19. The second voltage regulation portion 12 has a resistor 13, a resistor 15, and a zener diode 17. The control portion 14 has a program control 20, a control logic 21, a data-in buffer 22, a data-pad 23, a data-out buffer 24, a sense-amplifier 25, and a transistor 26. The flash EEPROM array with decode portion 16 has a decode section 28 having block-array decode transistors 29 and 30. The flash EEPROM array with decode portion 16 further has a decode and bias section 32, and an array of flash EEPROM cells 34. The decode and bias section 32 has a plurality of bit-line decode and bit-line bias transistors, such as transistors 35 and 36 respectively. The array of flash EEPROM cells 34 contains a plurality of flash EEPROM cells, such as flash EEPROM cell 37.

Resistor 13 has a first terminal connected to a variable power supply terminal labeled "$V_{pp}$", a second terminal connected to a first terminal of resistor 15 and to a power supply input of word-line driver circuit 27. Resistor 15 has a second terminal connected to a cathode terminal of zener diode 17. Zener diode 17 has an anode terminal connected to a common power supply terminal labeled "$V_{ss}$". The word-line driver circuit 27 has an address input labeled "address," and a plurality of control outputs labeled "word-lines." Resistor 18 has a first terminal connected to $V_{pp}$, and a second terminal connected to a cathode terminal of zener diode 19. The zener diode 19 has an anode terminal connected $V_{ss}$. The control outputs of word-line driver circuit 27 are word-line control signals, such as word-line 40. The program control 20 has a power supply input connected to $V_{pp}$, a control input connected to an output of the control logic 21, a data input connected to an output of data-in buffer 22, and a control output connected to a gate terminal of transistor 26. Transistor 26 has a drain terminal connected to the second terminal of resistor 18, and a source terminal connected to an input of sense-amplifier 25. The sense-amplifier 25 has an output connected to an input of the data-out buffer 24. The data-out buffer 24 has an output connected to both an input of data-in buffer 22 and an input/output terminal of data-pad 23. The block-array decode transistors, 29 and 30, each have a drain terminal connected to the input of sense-amplifier 25. Block-array decode transistor 29 has a gate terminal connected to an output of a bit-line decoder (not illustrated), labeled "$Y_{10}$," and a source terminal connected to a first common node (not labeled)

of the decode and bias section 32. Block-array decode transistor 30 has a gate terminal connected to an output of the bit-line decoder (not illustrated), labeled "$Y_{12}$," and a source terminal connected to a second common node (not labeled) of the decode and bias section 32. The subscripts associated with the outputs of the decoder (not illustrated), such as "10" in "$Y_{10}$," are provided to denote uniqueness among the decoder (not illustrated) output signals.

In the decode and bias section 32 the gate terminal of each bit-line bias transistor, such as bit-line bias transistor 36, is connected to a common control terminal labeled "program-bias." The source terminal of each bit-line bias transistor is connected to $V_{ss}$. The drain terminal of each bit-line bias transistor is connected to a predetermined bit-line within the array of flash EEPROM cells 34. The gate terminal of each bit-line decode transistor, such as bit-line decode transistor 35, is connected to a predetermined output of the bit-line decoder (not illustrated). Further, the gate terminal of each bit-line decode transistor is connected to the gate terminal of predetermined other bit-line decode transistor by using the same bit-line decoder output signal. The source terminal of each bit-line deocde transistor is connected to a predetermined bit-line, such as bit-line 38, within the array of flash EEPROM cells 34. The drain terminal of each bit-line decode transistor is connected to either the first or second common node (not labeled) within the decode and bias section 32.

Each flash EEPROM cell, such as cell 37, has a floating-gate and a control-gate. Further, the control-gate of predetermined flash EEPROM cells are connected to a common word-line, such as word-line 40, in a horizontal fashion as illustrated in FIG. 1. Predetermined flash EEPROM cells have their drain terminals connected to a common bit-line, such as bit-line 38, in a vertical fashion as illustrated in FIG. 1. The source terminal of each flash EEPROM cell is connected to an input terminal labeled "common-source."

Figure 2:
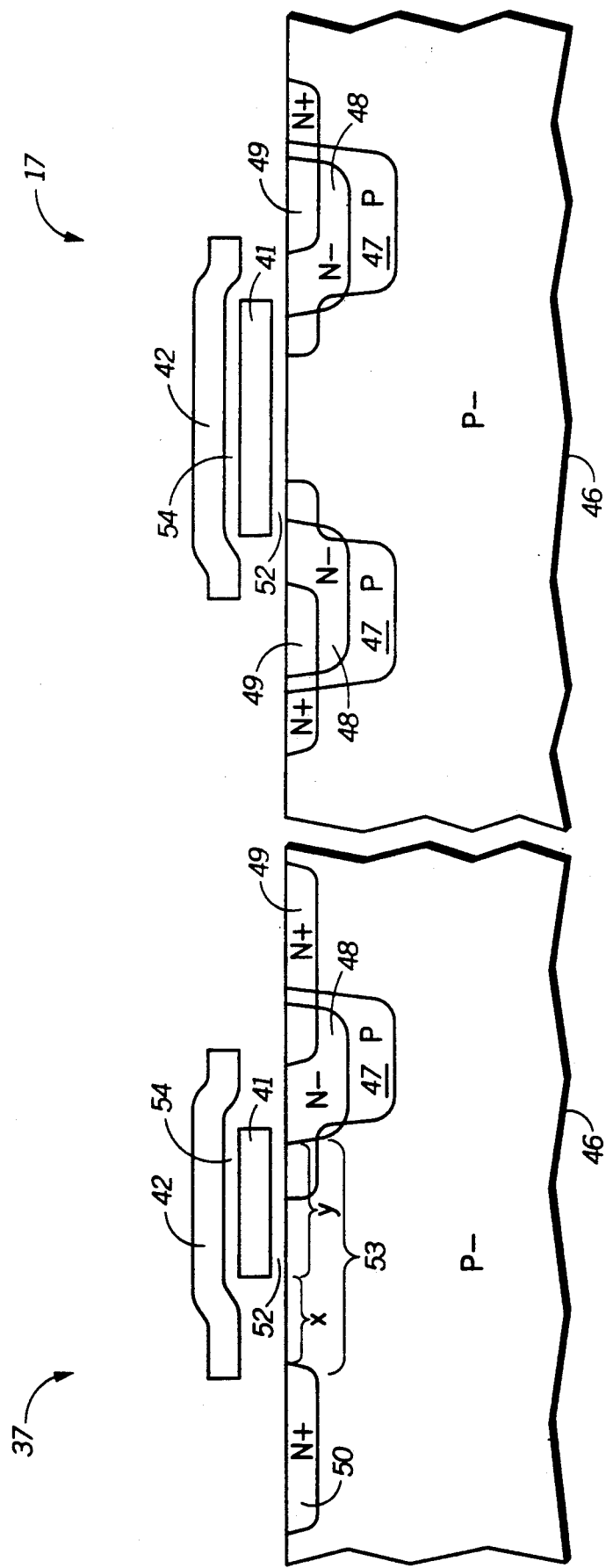
FIG. 2 illustrates in cross-sectional form a zener diode and flash EEPROM cell of FIG.1.

FIG. 2 illustrates a cross-sectional view of the flash EEPROM cell 37 and zener diode 17 of FIG. 1. Although zener diode 19 is not illustrated, zener diode 19 is identical in structure to zener diode 17. Flash EEPROM cell 37, and zener diode 17 and 19 are each formed in P− substrate 46. Flash EEPROM cell 37, and zener diodes 17 and 19 each has a P diffusion 47, an N− diffusion 48, a floating-gate 41, and a control-gate 42. Flash EEPROM cell 37 has an N+ diffusion 49 and 50, and zener diodes 17 and 19 each has two N+ diffusions 49. The floating-gate 41 is insulated from a channel region 53 by a thin gate oxide 52, and is insulated from the control-gate 42 by a dielectric material 54. The channel region 53 is divided into a control-gate channel region labeled "X," and a floating-gate channel region labeled "Y." The N− diffusion 48 is also termed a "drain extension implant."

Figure 3:
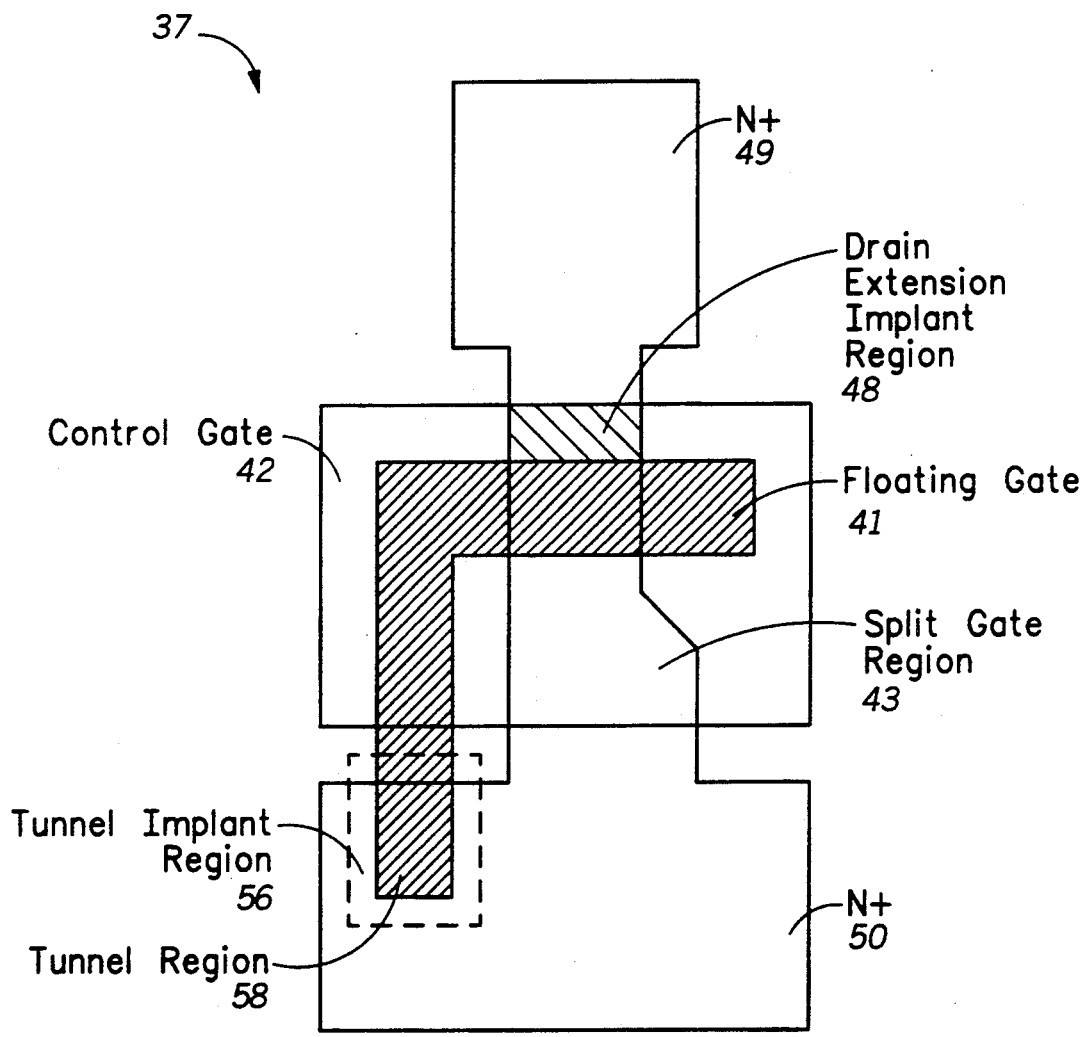
FIG. 3 illustrates in composite layout form one of the flash EEPROM cells of FIG. 1.

FIG. 3 illustrates a composite layout form of flash EEPROM cell 37 of FIG. 1 and FIG. 2, in accordance with the present invention. The flash EEPROM cell 37 of FIG. 3 is a floating gate transistor having an N+ source 50, and N+ drain 49, a floating-gate 41, a control-gate 42, a split gate region 43, a drain extension implant region 48, a tunnel implant region 56, and a tunnel region 58. The split gate region 43 of FIG. 3 is the same region as the X region of channel region 53 of FIG. 2.

The following processing steps apply to flash EEPROM cell 37, and zener diodes 17 and 19 which are formed concurrently. The P diffusion 47 is formed into the P− substrate 46, using a known process diffusion method. After which the N− diffusion 48 is formed primarily into the P diffusion 47, and partially into the P− substrate 46. The N+ diffusions, 49 and 50, are formed concurrently into the N− and P diffusions, and P− substrate, and is termed a "source/drain diffusion implant." Referring to the flash EEPROM cell 37 of FIG. 2, the source is labeled "50," and the drain is labeled 49. The drain 49 is connected to a bit-line, such as bit-line 38 of FIG. 1, and the source 50 is connected to a common anode labeled "common-source." The floating gate 41 is formed over the channel region 53, and the control gate 42 is formed over the floating gate 41, the diffusion implant regions 47–49, and the split gate region 43. The X region of the channel region 53, the control-gate channel region, is formed beneath the control-gate 42 that is not covered by the floating-gate 41. The Y region of the channel region 53, the floating-gate channel region, is formed beneath the floating-gate 41.

In operation, flash EEPROM cell 37 of FIGS. 1–3 is erased to a first logic state with a predetermined bulk erase procedure, and is programmed to a second logic state via a predetermined programming procedure. When flash EEPROM cell 37 is erased, the floating-gate 41 has a low threshold voltage ($V_t$), and when flash EEPROM cell 37 is programmed, the floating-gate 41 has a high $V_t$. When flash EEPROM cell 37 is erased, and control gate 42 is activated, the current sinking capability of flash EEPROM cell 37 is high. When the flash EEPROM cell is programmed, causing the $V_t$ of the Y region of channel region 53 to be high, and control gate 42 is activated, the current sinking capability of the programmed flash EEPROM cell is minimized.

In more detail, flash EEPROM cell 37 of FIGS. 2 and 3 is erased by concurrently applying a voltage of zero volts at control-gate 42, allowing drain 49 to electrically float, and applying a predetermined positive voltage at source 50. In response to the above conditions, electrons tunnel via a Fowler-Nordheim tunneling mechanism from the floating-gate 41 to the source 50. The $V_t$ of the Y region of channel region 53 is lowered as electrons tunnel from the floating-gate 41 to the source 50.

Flash EEPROM cell 37 is programmed by concurrently applying a predetermined positive voltage at control-gate 42, applying a second predetermined positive voltage at drain 49, and connecting source 50 to zero volts. The above conditions will result in a current within channel region 53 which produces hot-electrons. As the hot-electrons cross the thin gate oxide 52 and collect on the floating gate 41, the $V_t$ of the Y region of channel region 53 increases.

During programming, zener diode 19 provides a predetermined constant voltage at the cathode terminal when a predetermined higher voltage is present at $V_{pp}$. Data for programming the selected flash EEPROM cell is provided via the data pad 23, and is buffered to the program control 20 by the data-in buffer 22. In response to control logic 21, program control 20 connects the predetermined constant voltage at the cathode terminal of the zener diode 19 to the drain terminals of block-array decode transistors 29–30. A bit-line decoder (not illustrated), selectively activates predetermined transistors within the decode and bias portion 16. The selectively activated block-array decode transistors connect the voltage at the drain terminal of block-array decode transistors 29 and 30 to a predetermined bit-line. Also, during programming and program-bias signal activates each bias-transistor. The purpose of selectively activating a bias-transistor during programming will be discussed later. The output of the word-line driver circuit 27, which has a regulated voltate supplied by the voltage regulation portion 12, control-gate selects a predetermined row of flash EEPROM cells. The voltage level of the word-line signal during programming typically ranges between 8-10 volts.

When bit-line bias transistor 36 is activated, the regulated voltage provided by zener diode 19 is reduced in voltage at the selected bit-line. The reduction in voltage at the selected bit-line can prevent the drain junction of the flash EEPROM cells connected to the selected bit-line from breaking down. If the drain junction of a flash EEPROM cell breaks down, hot-electrons are injected into the immediate substrate and oxide region. When the hot-electrons are injected into the substrate and oxide, the logic state of flash EEPROM cells that surround the breakdown junction may be affected. The reduction in voltage at the selected bit-line is also necessary to minimize the inadvertent disturbing of the logic state of flash EEPROM cells whose drain terminals are connected to the selected bit-line. A programmed flash EEPROM cell that is not control-gate-selected, but whose drain terminal is connected to a selected bit-line may be inadvertently disturbed during programming via the Fowler-Nordheim tunneling mechanism. The Fowler-Nordheim tunneling mechanism is utilized to erase flash EEPROM cells during a bulk erase procedure. Unfortunately, the Fowler-Nordheim tunneling mechanism will also allow electrons captured on one or more floating gate of the flash EEPROM cells that are not control-gate-selected to tunnel from the floating-gate to the selected bit-line when the selected bit-line is at a high voltage level during programming. By limiting the voltage of a selected bit-line with a bias-transistor, such as bias-transistor 36, inadvertent disturbing of the logic state of a programmed flash EEPROM cell via the Fowler-Nordheim tunneling mechanism is minimized. The reduction in voltage at the selected bit-line is also desirable for optimizing the programming characteristics of the selected flash EEPROM cell. Since bias-transistor 36 shunts current from the selected bit-line during programming, the voltage swing of the selected bit line is minimized as the $V_t$ of the selected flash EEPROM cell increases during programming.

The problem of disturbing the logic state of a flash EEPROM cell during programming is extended to flash EEPROM cells that share a common word-line. When a flash EEPROM cell is in an erased logic state, receives an active word-line signal, and is connected to an un-selected bit-line, electrons may tunnel from the substrate 46 through the thin gate oxide 52 to the floating gate 41. As a result, the $V_t$ of floating gate 41 is increased. A solution to the inadvertent disturbing of an erased flash EEPROM cell is to regulate the voltage of the word-line signal during programming. The voltage regulation portion 12, which utilizes a zener diode, provides the necessary voltage regulation for word-line driver circuit 27 during programming.

When the logic state of a flash EEPROM cell has been disturbed, or is not optimally programmed, detecting the proper logic state of the flash EEPROM cell with a read operation is impaired. The read operation commences with a predetermined flash EEPROM cell being fully selected while the program control 20 deactivates transistor 26. Sense-amp 25 'senses' the current through the selected flash EEPROM cell, which represents the logic state of the flash EEPROM cell. The data-out buffer 24 receives the output of sense-amplifier 25, and provides a corresponding voltage level at data-pad 23 that represents the logic state of the selected flash EEPROM cell. For example, assume that flash EEPROM cell 37 has been previously programmed. When flash EEPROM cell 37 is fully selected by activating block-array decode transistor 29, bit-line decode transistor 35, and word-line 40, sense-amplifier 25 senses a lower flash EEPROM cell current condition. For this example, the lower flash EEPROM cell current condition represents a logic one. The logic one condition signals the data-out buffer 24 to provide a high voltage level at the output of data-pad 23. When the logic state of a flash EEPROM cell has been disturbed during programming, as previously discussed, the output of sense-amplifier 25 may be incorrect. For example, assume that flash EEPROM cell 37 has been previously programmed, and that the logic state of the remaining transistors connected to bit-line 38 remain erased. Assume also that during the procedure of programming flash EEPROM cell 37, the logic state of one or more of the erased flash EEPROM cells connected to bit-line 38 are disturbed, i.e. inadvertently programmed. When sense-amplifier 25 senses the cell current of a flash EEPROM cell with a disturbed logic state, as described above, sense-amplifier 25 will sense a low cell current condition, which is the incorrect intended logic state for the selected flash EEPROM cell.

In summary, bit-line voltage regulation provided by zener diode 19 and bias-transistor 36 prevents the drain junction of a flash EEPROM cell from breaking down and causing a run-away disturb program. The voltage regulation also adjusts the voltage on the selected bit-line for optimum programming characteristics and minimizes disturbing the logic state of programmed flash EEPROM cells connected to the common bit-line. Voltage regulation portion 12 provides a regulated voltage to word-line driver circuit 27 during programming for optimum programming characteristics. Regulating the voltage to word-line driver circuit 27 minimizes disturbing the erased logic state of flash EEPROM cells that share a common word-line.

Although specific N-channel transistor are discussed, it should be well understood that the present invention may be implemented with other types of transistors and transistors having other conductivities. It should be well understood that although the preferred embodiment illustrates particular diffusion conductivities used to form the flash EEPROM cell and zener diode, the diffusion conductivities may be reversed to achieve the same results. Although a particular decoding scheme is illustrated for selecting a flash EEPROM cell, any appropriate decoding scheme may be utilized.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A regulated programming circuit for a nonvolatile memory having a plurality of nonvolatile memory bit cells arranged in an array of bit-line columns and word-line rows, comprising:

a first voltage regulation means having a first diode, the first voltage regulation means providing a regulated internal voltage by selectively receiving a programming voltage having a value larger than the internal voltage which is selectively coupled to the bit-line columns;

bit-line decoding means coupled to the first voltage regulation means, the bit line decoding means selectively coupling the internal voltage to a predetermined portion of the bit-line columns during programming of the memory;

a plurality of bit-lines transistors, each of the bias transistors being directly connected to a predetermined one of the bit-line columns and having a control electrode for receiving a predetermined bias signal during programming of the memory, each of the bias transistors providing a second level of voltage regulation of one of the bit-line columns by coupling the one bit-line column to a reference voltage terminal to further reduce voltage;

word-line voltage regulation means having a second diode, the word-line voltage regulation means also receiving the voltage having a value larger than the internal voltage, the word-line voltage regulation means providing a plurality of word-line regulated voltages, each of which is directly connected to a predetermined one of the word-line rows; and a plurality of floating-gate transistors, each transistors being connected to a predetermined bit-line column and word-line row to form a memory bit cell.

2. The regulated programming circuit of claim 1 wherein the nonvolatile memory bit cells are flash EEPROM cells.

3. In a nonvolatile memory having a plurality of nonvolatile memory bit cells arranged in an array of bit-line columns and word-line rows, a method of operation of the nonvolatile memory during programming of the nonvolatile memory, comprising the steps of:

receiving a voltage having a magnitude larger than a magnitude of an internal voltage which is coupled to the bit-columns and providing a regulated output voltage therefrom;

using at least one decoding transistor to directly connect the regulated output voltate to a predetermined bit-line column as the internal voltage;

directly connecting a predetermined one of a plurality of bias transistors to each of the bit-line columns and to a reference voltage terminal, each bias transistor selectively shunting current from the predetermined bit-line column to the reference voltage terminal to further regulate the internal voltage at the predetermined bit-line column; and further using the received voltage to provide a plurality of regulated word-line voltages, each of the word-line voltages being directly connected to a predetermined one of the word-line rows.

4. The method of claim 3 wherein the step of receiving a voltage and providing a regulated output voltage therefrom further comprising using a zener diode to generate the regulated output voltage.

5. The method of claim 3 wherein a first zener diode is used to provide the regulated output voltage and a second zener diode is used to provide the regulated word-line voltages.

6. A regulated programming circuit for a nonvolatile memory having a plurality of nonvolatile memory bit cells arranged in an array of bit-line columns and word-line rows, comprising:

a first voltage regulation means having a first zener diode, the first voltage regulation means receiving a voltage having a value substantially larger than an internal voltage, which is connected to the bit-line columns and provides a regulated output voltage as the internal voltage;

a second voltage regulation means connected directly to each of the bit-line columns, for creating a biasing current from the bit-line columns to a reference voltage terminal only during programming of the memory, and to further voltage regulate the bit-line columns to a predetermined voltage;

a third voltage regulation means having a second zener diode, the third voltage regulation means providing a plurality of voltage regulated word-line signals, each word-line signal being directly connected to one of the word-line rows; and a plurality of floating-gate transistors, each transistor being connected to a predetermined bit-line column to form a memory bit cell.

7. The regulated programming circuit of claim 6 wherein the nonvolatile memory bit cells are flash EEPROM cells.

8. The regulated programming circuit of claim 6 wherein the second voltage regulation means coupled to the first voltage regulation means comprises a plurality of selectively activated biasing transistors, each of which is connected to a predetermined one of the bit-line columns.

* * * * *